US012635390B2

(12) United States Patent
Ni et al.

(10) Patent No.: US 12,635,390 B2
(45) Date of Patent: May 19, 2026

(54) DISPLAY PANEL INCLUDING INORGANIC LAYER WITH OPENINGS IN NON-DISPLAY AREA, AND DISPLAY TERMINAL

(71) Applicant: WUHAN CHINA STAR OPTOELECTRONICS SEMICONDUCTOR DISPLAY TECHNOLOGY CO., LTD., Wuhan (CN)

(72) Inventors: Jing Ni, Wuhan (CN); Kan Wang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 456 days.

(21) Appl. No.: 18/195,593

(22) Filed: May 10, 2023

(65) Prior Publication Data

US 2024/0032396 A1     Jan. 25, 2024

Related U.S. Application Data

(63) Continuation of application No. PCT/CN2023/083200, filed on Mar. 22, 2023.

(30) Foreign Application Priority Data

Jul. 19, 2022    (CN) .......................... 202210848077.9

(51) Int. Cl.
*H10K 59/122*       (2023.01)
*H10K 59/80*        (2023.01)
*H10K 102/00*       (2023.01)

(52) U.S. Cl.
CPC ....... *H10K 59/8731* (2023.02); *H10K 59/122* (2023.02); *H10K 2102/311* (2023.02)

(58) Field of Classification Search
CPC ..................... H10K 59/8731; H10K 2102/311
See application file for complete search history.

(56) References Cited

U.S. PATENT DOCUMENTS

2015/0303406 A1 * 10/2015 Kim ................... H10K 59/8731
                                                                257/40
2017/0062760 A1 * 3/2017 Kim ..................... H10K 50/844
(Continued)

FOREIGN PATENT DOCUMENTS

CN        106653818 A * 5/2017 ........... H01L 23/562
CN        108232033 A * 6/2018 ........... H10K 50/844
(Continued)

OTHER PUBLICATIONS

PCT International Search Report for International Application No. PCT/CN2023/083200, mailed on Jun. 16, 2023, 9pp.
(Continued)

*Primary Examiner* — Peter Bradford
(74) *Attorney, Agent, or Firm* — The Roy Gross Law Firm, LLC; Roy D. Gross

(57)                ABSTRACT

A display panel has a display region and a non-display region, and the non-display region includes a second bendable region. The display panel includes a substrate, a first inorganic layer, an organic protection layer, a light-emitting function layer, an encapsulation layer, and a second inorganic layer. The second inorganic layer is disposed on a side of the encapsulation layer away from the substrate and extends from the display region to the non-display region and beyond a boundary of the encapsulation layer. A plurality of openings are provided in an edge part of the second inorganic layer away from the display region.

19 Claims, 4 Drawing Sheets

(56)     References Cited

U.S. PATENT DOCUMENTS

| | | | | |
|---|---|---|---|---|
| 2018/0040671 A1* | 2/2018 | Miyake | ................ | H10K 59/131 |
| 2018/0040672 A1* | 2/2018 | Park | ........................ | H10K 59/40 |
| 2020/0119103 A1* | 4/2020 | Miyake | ................. | H10K 59/40 |
| 2020/0194725 A1* | 6/2020 | Qin | .................... | H10K 50/8445 |
| 2021/0074795 A1 | 3/2021 | Tomioka | | |
| 2021/0210722 A1 | 7/2021 | Li | | |

FOREIGN PATENT DOCUMENTS

| | | | | | |
|---|---|---|---|---|---|
| CN | 108831303 A | | 11/2018 | | |
| CN | 109585688 A | | 4/2019 | | |
| CN | 109786426 A | | 5/2019 | | |
| CN | 110504295 A | | 11/2019 | | |
| CN | 111430442 A | | 7/2020 | | |
| CN | 113078195 A | | 7/2021 | | |
| CN | 115275045 A | | 11/2022 | | |
| KR | 20130081513 A | * | 7/2013 | ....... | G02F 1/133308 |
| WO | 2019235154 A1 | | 12/2019 | | |

OTHER PUBLICATIONS

PCT Written Opinion of the International Searching Authority for International Application No. PCT/CN2023/083200, mailed on Jun. 16, 2023, 9pp.
Chinese Office Action issued in corresponding Chinese Patent Application No. 202210848077.9 dated Feb. 25, 2023, pp. 1-5.

* cited by examiner

Stress (Mpa)

DISPLAY PANEL INCLUDING INORGANIC LAYER WITH OPENINGS IN NON-DISPLAY AREA, AND DISPLAY TERMINAL

CROSS-REFERENCE TO RELATED APPLICATIONS

This application is a continuation of International Application No. PCT/CN2023/083200, filed on Mar. 22, 2023, which claims priority to Chinese Patent Application No. 202210848077.9, filed on Jul. 19, 2022. The disclosures of the aforementioned applications are incorporated herein by reference in their entireties.

TECHNICAL FIELD

The present disclosure relates to display technologies, and in particular, to display panels and display terminals.

BACKGROUND

Organic light emitting diodes (OLEDs) have great development potential in aspects of solid state lighting and panel display, and have attracted great attention from academia and industry. The OLED panel can be made lighter and thinner, so flexible OLED display technology will be a future trend. The substrate commonly used in the flexible OLED display panel is generally a flexible substrate made of a material such as polyimide, and a thin film transistor disposed on the substrate may regulate the OLED light-emitting device by a control signal. Inorganic encapsulation layers and organic encapsulation layers overlapping with each other may be disposed to coat the OLED light-emitting device to achieve water and oxygen protection. A touch film layer may be disposed to cover the encapsulation layers to realize a touch function.

With increasingly higher requirements for bending and a large-angle cover plate configuration of the display panel, the challenge to the limit of the screen body becomes increasingly larger. In this case, in order to adapt to the cover plate with higher requirements, an inorganic film with a large stress is usually used as an inorganic layer in the touch film layer. However, during the preparation process, the inorganic film with a large stress may peel off at a boundary away from the display region, especially at the bottom border area of the display panel.

SUMMARY

In view of the above, an embodiment of the present disclosure provides a display panel having a display region and a non-display region on at least one side of the display region, the non-display region including a second bendable region close to the display region, the display panel including a substrate, a first inorganic layer, an organic protection layer, a light-emitting function layer, an encapsulation layer, and a second inorganic layer. The first inorganic layer is disposed on a side of the substrate, and provided with a groove in the second bendable region. The organic protection layer is disposed on a side of the first inorganic layer away from the substrate, and covers the groove. The light-emitting function layer is disposed on the side of the first inorganic layer away from the substrate, and includes a light-emitting pixel disposed in the display region. The encapsulation layer is disposed on a side of the light-emitting function layer away from the substrate, and the encapsulation layer extends from the display region to the non-display region, and has a boundary with a first spacing from the groove. The second inorganic layer is disposed on a side of the encapsulation layer away from the substrate, and the second inorganic layer extends from the display region to the non-display region and exceeds the boundary of the encapsulation layer, wherein a plurality of openings are provided on an edge part of the second inorganic layer away from the display region.

Another embodiment of the present disclosure provides a display terminal including a terminal body and a display panel integrated with the display panel, the display panel having a display region and a non-display region on at least one side of the display region, the non-display region including a second bendable region close to the display region, the display panel including:

a substrate;

a first inorganic layer disposed on a side of the substrate, and provided with a groove in the second bendable region;

an organic protection layer being disposed on a side of the first inorganic layer away from the substrate, and covering the groove;

a light-emitting function layer disposed on the side of the first inorganic layer away from the substrate, and comprising a light-emitting pixel disposed in the display region;

an encapsulation layer disposed on a side of the light-emitting function layer away from the substrate, the encapsulation layer extending from the display region to the non-display region, and having a boundary with a first spacing from the groove; and a second inorganic layer disposed on a side of the encapsulation layer away from the substrate, and the second inorganic layer extending from the display region to the non-display region and exceeding the boundary of the encapsulation layer, wherein a plurality of openings are provided in an edge part of the second inorganic layer away from the display region.

DETAILED DESCRIPTION

Some embodiments of the present disclosure will be described in detail below with reference to the accompanying drawings. It should be understood that the embodiments described herein are merely illustrative of the present disclosure and are not intended to limit the present disclosure.

It is to be noted that, the inorganic layer in the touch film layer generally tends to use an inorganic film with a relatively large stress in order to adapt to the bending and large-angle cover plate configuration. However, the inorganic film with a relatively large stress may peel off at the boundary thereof away from the display region, particularly at the bottom border area of the display panel, during the preparation process. Embodiments of the present disclosure can address the above defect.

Figure 1:
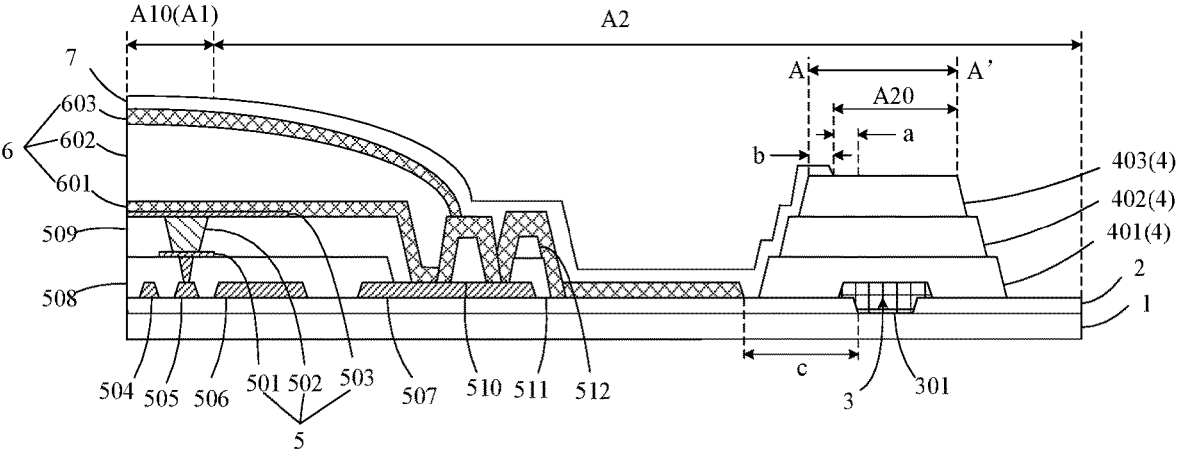
FIG. 1 is a schematic diagram of a basic structure of a display panel according to an embodiment of the present disclosure.

FIGS. 1 and 2A-2D show a schematic diagram of a basic structure of a display panel according to an embodiment of the present disclosure and top-views of A-A' region of the display panel of FIG. 1, respectively. The display panel includes a display region A1 and a non-display region A2 disposed on at least one side of the display region A1. The display region A1 includes a first bendable region A10 close to the non-display region A2, and the non-display region A2 includes a second bendable region A20 close to the first bendable region A10. It is to be noted that the display panel according to the embodiments of the present disclosure is a curved display panel. The first bendable region A10 is disposed close to the non-display region A2 and has a bending curvature greater than 0 and less than or equal to 90 degrees, and a curved surface formed in the first bendable region A10 also has a display function. The second bendable region A20 is a region which is further bent after the first bendable region A10 is bent, so as to bend an integrated circuit chip (not shown) in the non-display region A2 to the back of the display panel to reduce the bottom border and increase the screen-to-body ratio.

In an embodiment of the present disclosure, the display panel includes a substrate 1, a first inorganic layer 2, an organic protection layer 4, a light-emitting function layer 5, an encapsulation layer 6, and a second inorganic layer 7. The first inorganic layer 2 is disposed on a side of the substrate 1, and has a groove 3 in the second bendable region A20. The organic protection layer 4 is disposed on a side of the first inorganic layer 2 away from the substrate 1, and covers the groove 3. The light-emitting function layer 5 is disposed on a side of the first inorganic layer 2 away from the substrate 1, and includes a light-emitting pixel 502 disposed in the display region A1. The encapsulation layer 6 is disposed on a side of the light-emitting function layer 5 away from the substrate 1, and extends from the display region A1 to the non-display region A2, wherein a boundary of the encapsulation layer 6 is spaced from the groove 3 by a first spacing c. The second inorganic layer 7 is disposed on a side of the encapsulation layer 6 away from the substrate 1. The second inorganic layer 7 extends from the display region A1 to the non-display region A2 and exceeds the boundary of the encapsulation layer 6. A plurality of openings 701 are provided in an edge part of the second inorganic layer 7 away from the display region A1.

Since the display panel has a bending configuration, there is a difference in the height of the display region A1 and the non-display region A2 after the display panel is encapsulated, so that the second inorganic layer 7 in the touch film layer located on the encapsulation layer 6 needs to use a high-stress inorganic film to improve the effect of covering the encapsulation layer 6. In the embodiments of the present disclosure, by providing the plurality of openings 701 in the edge part of the second inorganic layer 7 away from the display region A1, the internal stress of the film layer at the edge part of the second inorganic layer 7 away from the display region A1 can be reduced, thereby reducing the risk of peeling off of the second inorganic layer 7 at the boundary away from the display region A1, and effectively addressing the problem that the second inorganic layer 7 having a large stress on the bottom border region of the display panel is prone to peel off at the boundary away from the display region A1 during the preparation.

It is to be noted that the openings 701 are not formed after the formation of the second inorganic layer 7, but are formed together with the second inorganic layer 7 during the formation of the second inorganic layer 7. The region corresponding to the openings 701 may be shielded by a photomask so that the region corresponding to the openings 701 is not deposited a material. If the second inorganic layer 7 is formed firstly, and then the openings 701 are formed, the internal stress of the film layer of the second inorganic layer 7 cannot be reduced.

In an embodiment, an organic filler material 301 is disposed in the groove 3. The organic protection layer 4 covers the organic filler material 301.

It is to be noted that a plurality of first inorganic layers 2 may be disposed between the substrate 1 and a source 504, a drain 505, a power supply line 506, and a signal line 507. Since the plurality of first inorganic layers 2 are less flexible, the embodiment of the present disclosure provides the groove 3 on the plurality of first inorganic layers 2 at a position corresponding to the second bendable region A20, and then provides the organic filler material 301 in the groove 3 to enhance the flexibility of the second bendable region A20.

It is to be noted that the light-emitting function layer 5 includes an anode layer 501, a light-emitting pixel 502, and a cathode layer 503. A planarization layer 508 is disposed between the anode layer 501 and the source 504, the drain 505, the power supply line 506 and the signal line 507. The anode layer 501 is electrically connected to the drain 505 by a through hole in the planarization layer 508. The display panel further includes a pixel definition layer 509 disposed on the planarization layer 508 and the anode layer 501. The pixel definition layer 509 includes a plurality of pixel openings, and the light emitting pixel 502 is disposed in each of the pixel openings. The planarization layer 508 and the pixel definition layer 509 are an organic film layer, respectively.

In an embodiment, the display panel further includes a blocking wall structure located in the non-display region A2. The blocking wall structure includes a first bank portion 510 disposed close to the display region A1, and a second bank portion disposed on a side of the first bank portion 510 away from the display region A1. The second bank portion includes a first sub-bank portion 511 and a second sub-bank portion 512 located on a side of the first sub-bank portion 511 away from the substrate 1. The first sub-bank portion 511 is formed in the same process as the planarization layer 508, and the first bank portion 510 and the second sub-bank portion 512 are formed in the same process as the pixel definition layer 509.

It is to be noted that a plurality of organic protection layers 4 are laminated in a light-emitting direction of the display panel. The plurality of organic protection layers 4 specifically are a first organic protection layer 401, a second organic protection layer 402, and a third organic protection layer 403, respectively. The first organic protection layer 401 is disposed in the same layer as the planarization layer 508 located in the display region A1. The second organic protection layer 402 is disposed in the same layer as the pixel definition layer 509 located in the display region A1. The third organic protection layer 403 is a supporting column.

The signal line 507 in the display region A1 needs to be electrically connected to the integrated circuit chip (not shown) through the second bendable region A20. The signal line 507 may be routed between the organic filler material 301 and the substrate 1 or between the organic filler material 301 and the organic protection layer 4. The first organic protection layer 401 and the second organic protection layer 402 are used for flatting the signal line 507, and the third organic protection layer 403 is used to support a mask used in forming the light-emitting pixel 502. The first organic protection layer 401 is formed in the same process as the planarization layer 508, and the second organic protection layer 402 is formed in the same process as the pixel definition layer 509.

In an embodiment, a first orthographic projection of the second inorganic layer 7 on the substrate 1 partially overlaps a second orthographic projection of the organic protection layer 4 on the substrate 1. That is, the edge part of the second inorganic layer 7 away from the display region A1 overlaps the organic protection layer 4.

In an embodiment, an orthographic projection of the plurality of openings 701 on the substrate 1 at least partially overlaps an orthographic projection, on the substrate 1, of a top surface of the organic protection layer 4 away from the substrate 1.

In this embodiment, the openings 701 are formed directly above the organic protection layer 4, so that the internal stress of the film layer of the overlapping portion of the second inorganic layer 7 with the organic protection layer 4 can be reduced, and the interlayer stress between the second inorganic layer 7 and the organic protection layer 4 also can be reduced, thereby reducing the risk of peeling between the second inorganic layer 7 and the organic protection layer 4.

In an embodiment, the orthographic projection of the plurality of openings 701 on the substrate 1 at least partially overlaps an orthographic projection of a side slope of the organic protection layer 4 close to the display region on the substrate 1.

In this embodiment, the openings 701 are formed at a position corresponding to the side slope of the organic protection layer 4 close to the display region A1, so that the interlayer stress between the second inorganic layer 7 and the slope of the organic protection layer 4 can be reduced, thereby reducing the risk of peeling between the second inorganic layer 7 and the organic protection layer 4.

In an embodiment, the internal stress of the film layer of a region where the first orthographic projection of the second inorganic layer 7 on the substrate 1 overlaps the second orthographic projection of the organic protection layer 4 on the substrate 1 is less than the internal stress of the film layer of a region where the first orthographic projection of the second inorganic layer 7 on the substrate 1 does not overlap the second orthographic projection of the organic protection layer 4 on the substrate 1.

It is to be understood that the present embodiments can reduce the risk of peeling between the second inorganic layer 7 and the organic protection layer 4, by setting the internal stress of the film layer of the region where the second inorganic layer 7 overlaps the organic protection layer 4 to be less.

In an embodiment, the internal stress of the film layer of the region where the first orthographic projection of the second inorganic layer 7 on the substrate 1 does not overlap the second orthographic projection of the organic protection layer 4 on the substrate 1 is greater than the internal stress of the film layer of the first inorganic layer 2.

It is to be noted that the region where the second inorganic layer 7 does not overlap the organic protection layer 4 is in contact with the first inorganic layer 2. In this embodiment, the internal stress of the film layer of the region where the second inorganic layer 7 does not overlap the organic protection layer 4 is set to be greater than the internal stress of the film layer of the first inorganic layer 2, so that the bonding effect of the second inorganic layer 7 with the first inorganic layer 2 can be improved.

In an embodiment, the encapsulation layer 6 includes a first inorganic encapsulation layer 601, an organic encapsulation layer 602, and a second inorganic encapsulation layer 603. The first inorganic encapsulation layer 601 is located on a side of the light-emitting function layer 5 away from the substrate 1. The organic encapsulation layer 602 is located on a side of the first inorganic encapsulation layer 601 away from the substrate 1. The second inorganic encapsulation layer 603 is located on a side of the organic encapsulation layer 602 away from the substrate 1. The internal stress of the film layer of the region where the first orthographic projection of the second inorganic layer 7 on the substrate 1 does not overlap the second orthographic projection of the organic protection layer 4 on the substrate 1 is greater than the internal stress of the film layer of the second inorganic encapsulation layer 603.

The present embodiment allows the second inorganic layer 7 to cover the encapsulation layer 6 better, by setting the internal stress of the film layer of the region where the second inorganic layer 7 does not overlap the organic protection layer 4 to be larger than the internal stress of the film layer of the second inorganic encapsulation layer 603.

In an embodiment, in a direction from the display region A1 to the non-display region A2, the region where the first orthographic projection of the second inorganic layer 7 on the substrate 1 overlaps the orthographic projection, on the substrate 1, of the top surface of the organic protection layer 4 away from the substrate 1 has a width b greater than or equal to 10 microns.

In this embodiment, by setting the width b of the region where the second inorganic layer 7 overlaps the organic protection layer 4 to be greater than or equal to 10 microns, the peeling caused by too small overlapping width between the second inorganic layer 7 and the organic protection layer 4 underneath is avoided.

In an embodiment, in the direction from the display region A1 to the non-display region A2, a distance a between the boundary of the second inorganic layer 7 away from the display region A1 and an end of the groove 3 close to the display region A1 is greater than or equal to 5 microns.

Specifically, the distance a is present between the boundary of the second inorganic layer 7 away from the display region A1 and the groove 3 in a horizontal direction. The distance a corresponds to a pre-bendable region. In this embodiment, the distance a is disposed between the second inorganic layer 7 and the groove 3, and a is greater than or equal to 5 microns, so as to prevent the second inorganic layer 7 from peeling off from the organic protection layer 4 due to extensively bending curvature during the bending process.

Figure 2A:
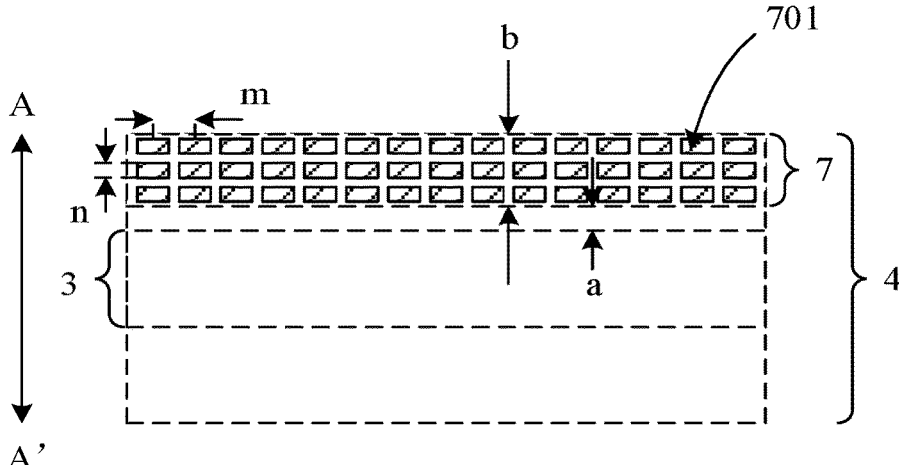
FIGS. 2A-2D are respective top views of A-A' area in the display panel of FIG. 1 according to different embodiments of the present disclosure.

In an embodiment, the plurality of openings 701 are arranged in rows and columns (as shown in FIG. 2A). In FIG. 2A, a configuration of three rows and fifteen columns is illustrated as an example. The specific number of rows and columns depends on the area of the second inorganic layer 7 exceeding the boundary of the encapsulation layer 6, the width n of the openings 701, and a spacing in between the centers of two adjacent openings 701.

Figure 2B:
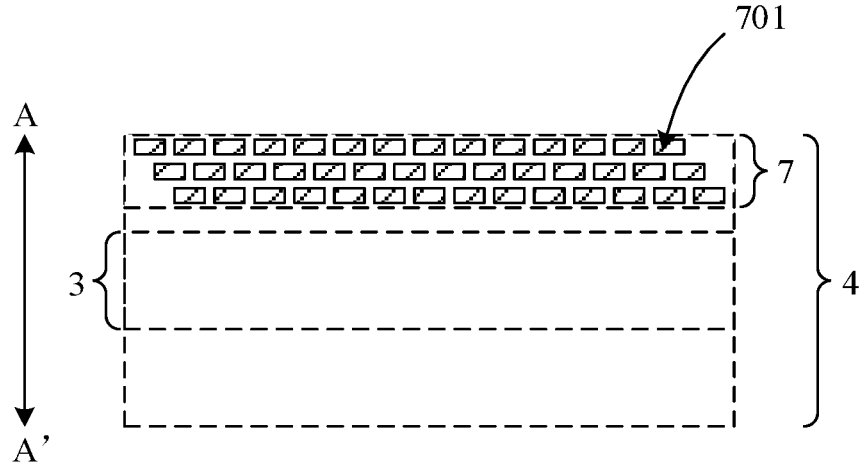

In an embodiment, the plurality of openings 701 are arranged row by row, and a first opening of the openings 701 is close to a region between two adjacent ones of the openings 701 in a row adjacent to the first opening (as shown in FIG. 2B).

Figure 2C:
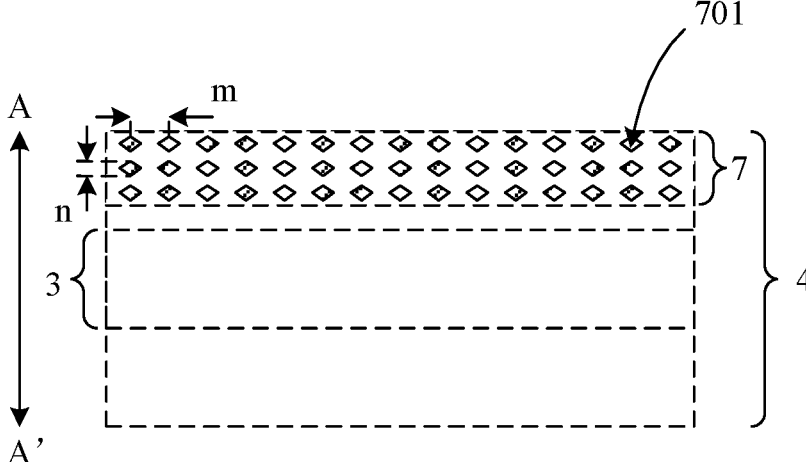
Figures 2D, 3:
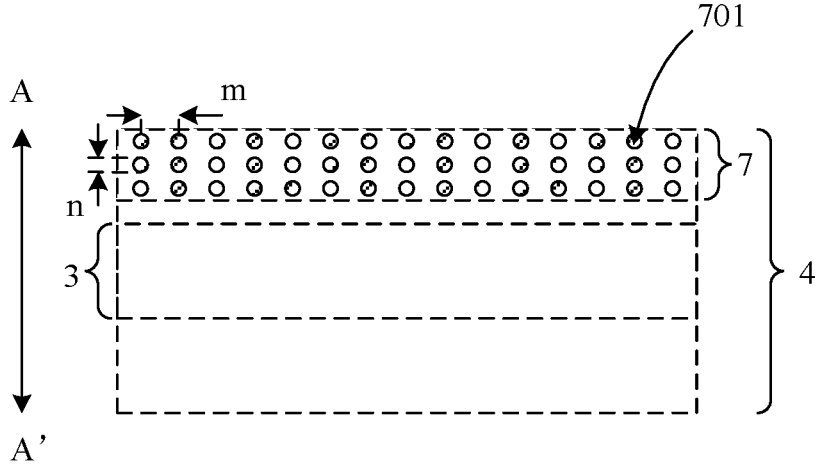
FIG. 3 is a schematic diagram of comparison of stress of a surface of an organic protection layer before improvement with that after improvement according to an embodiment of the present disclosure.

In an embodiment, the shape of the openings 701 is any one of a circle (as shown in FIG. 2D), a triangle, a rectangle (as shown in FIGS. 2A and 2B), and a diamond (as shown in FIG. 2C) in a plane perpendicular to a light exit direction of the display panel. The present disclosure is not limited thereto, and in other embodiments, the shape of the openings 701 may be any other regular pattern in the plane perpendicular to the light exit direction of the display panel.

In an embodiment, in the direction from the display region A1 to the non-display region A2, a width n of each of the openings 701 is greater than or equal to 3 microns, and the spacing in between the centers of two adjacent openings 701 is greater than or equal to 5 microns. It is to be understood that in this embodiment, by setting the width n of each of the openings 701 to be greater than or equal to 3 microns, and the spacing in between the centers of two adjacent openings 701 to be greater than or equal to 5 microns, the internal stress of the film layer of the second inorganic layer 7 may be reduced better.

FIG. 3 illustrates comparison of a stress of the surface of the organic protection layer before the improvement with that after the improvement according to an embodiment of the present disclosure. It is to be noted that the organic protection layer herein is the third organic protection layer 403 in contact with the second inorganic layer 7. Before the improvement (the openings 701 are not disposed on the second inorganic layer 7), the stress of the surface of the side where the third organic protection layer 403 is in contact with the second inorganic layer 7 is 4.7 MPa. After the improvement (the openings 701 are disposed on the second inorganic layer 7), the stress of the surface of the side where the third organic protection layer 403 is in contact with the second inorganic layer 7 is 4.2 MPa. That is, it is found in the embodiment of the present disclosure by simulation that the film stress may be significantly reduced by about 10% before and after the improvement.

Figure 4:
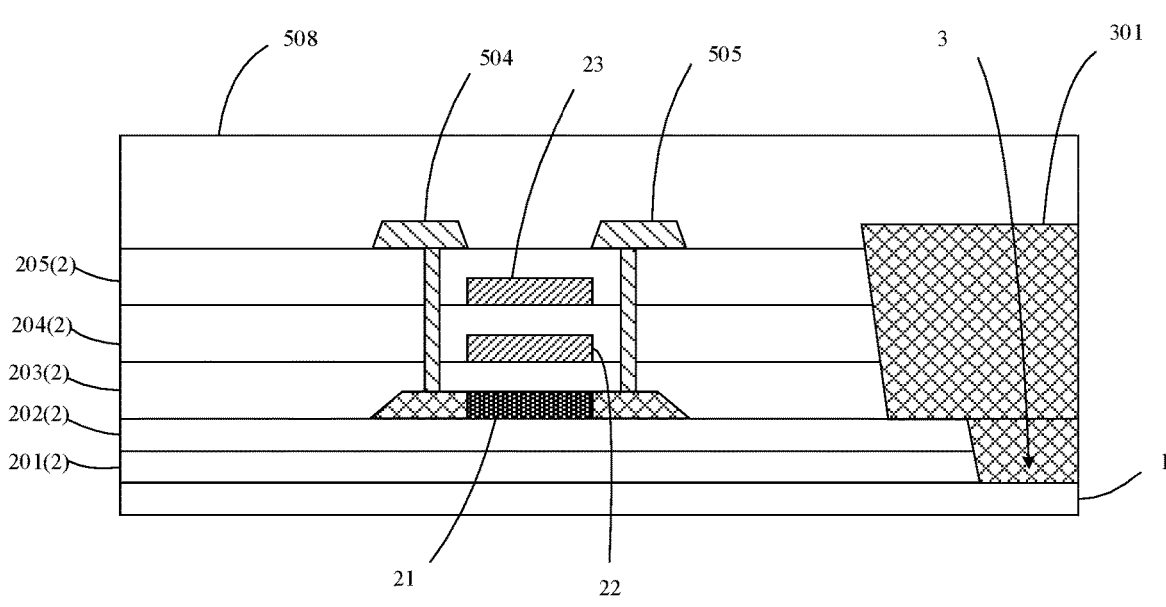
FIG. 4 is a schematic diagram of a basic structure of a groove according to an embodiment of the present disclosure.

Referring to FIG. 4, it is a schematic diagram of a basic structure of a groove according to an embodiment of the present disclosure. Specifically, a barrier layer 201, a buffer layer 202, an active layer 21, a first gate insulating layer 203, a first gate layer 22, a second gate insulating layer 204, a second gate layer 23, and an interlayer insulating layer 205 are sequentially disposed between the substrate 1 and the source and drain 504 and 505. The source 504 and the drain 505 are located on the interlayer insulating layer 205, and electrically connected to two ends of the active layer 21, respectively. The groove 3 penetrates through the interlayer insulating layer 205, the second gate insulating layer 204, the first gate insulating layer 203, the buffer layer 202, and the barrier layer 201 from top to bottom.

Figure 5A:
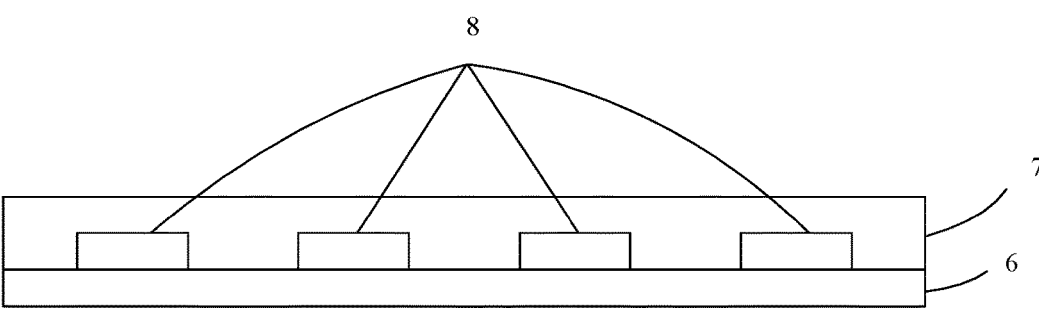
FIGS. 5A and 5B are respective schematic diagrams of a basic structure of a touch electrode layer according to different embodiments of the present disclosure.
Figure 5B:
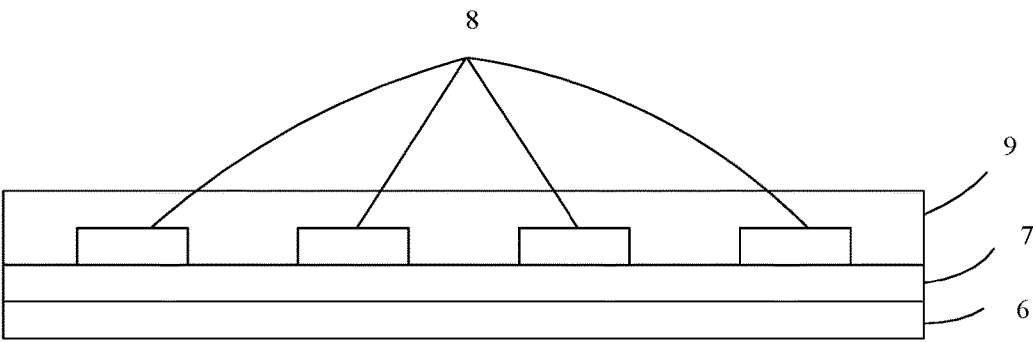

Referring to FIGS. 5A and 5B, there is shown a schematic diagram of a basic structure of a touch electrode layer according to an embodiment of the present disclosure. In this embodiment, the display panel includes a touch electrode layer 8, which is positioned between the encapsulation layer 6 and the second inorganic layer 7 (as shown in FIG. 5A). Alternatively, the touch electrode layer 8 is located on a side of the second inorganic layer 7 away from the encapsulation layer 6 (as shown in FIG. 5B).

The second inorganic layer 7 according to the embodiments of the present disclosure is an inorganic layer in a touch film layer. Specifically, the second inorganic layer 7 may be an inorganic layer covering the touch electrode layer 8 or an inorganic layer inside the touch electrode layer 8.

Here, as shown in FIG. 5B, the display panel further includes a protection layer 9 covering the touch electrode layer 8.

An embodiment of the present disclosure further provides a display terminal including a terminal body and the display panel described above. The terminal body and the display panel are integrated together with each other. Specific structure of the display panel may refer to FIGS. 1 to 5B and related descriptions. Details are not repeated herein. The display terminal according to the embodiments of the present disclosure may be a product or a component having a display function such as a mobile phone, a tablet computer, a notebook computer, a television, a digital camera, or a navigator.

It can be understood by those of ordinary skill in the art that equivalent substitutions or modifications may be made in accordance with the technical solutions of the present disclosure and inventive concepts thereof, and all of such modifications or substitutions are intended to fall within the scope of the claims appended hereto.

What is claimed is:

1. A display panel having a display region and a non-display region on at least one side of the display region, the non-display region comprising a second bendable region close to the display region, the display panel comprising:
   a substrate;
   a first inorganic layer disposed on a side of the substrate and provided with a groove in the second bendable region;
   an organic protection layer being disposed on a side of the first inorganic layer away from the substrate and covering the groove;
   a light-emitting function layer being disposed on the side of the first inorganic layer away from the substrate and comprising a light-emitting pixel disposed in the display region;
   an encapsulation layer disposed on a side of the light-emitting function layer away from the substrate, the encapsulation layer extending from the display region to the non-display region, wherein in a cross-section view of the display panel, a first spacing is formed between an edge of the encapsulation layer away from the display region and the groove; and
   a second inorganic layer disposed on a side of the encapsulation layer away from the substrate, the second inorganic layer extending from the display region to the non-display region and beyond the edge of the encapsulation layer,
   wherein a plurality of openings are provided in an edge part of the second inorganic layer away from the display region, and an orthographic projection of the plurality of openings on the substrate at least partially overlaps an orthographic projection, on the substrate, of a side slope of the organic protection layer close to the display region.

2. The display panel of claim 1, wherein a first orthographic projection of the second inorganic layer on the substrate partially overlaps a second orthographic projection of the organic protection layer on the substrate.

3. The display panel of claim 2, wherein an orthographic projection of the plurality of openings on the substrate at least partially overlaps an orthographic projection, on the substrate, of a top surface of the organic protection layer away from the substrate.

4. The display panel of claim 2, wherein
   the display region comprises a first bendable region close to the non-display region; and an internal stress of the second inorganic layer in a first area where the first orthographic projection overlaps the second orthographic projection is less than that in a second area where the first orthographic projection does not overlap the second orthographic projection.

5. The display panel of claim 4, wherein the internal stress of the second inorganic layer in the second area is greater than an internal stress of the first inorganic layer.

6. The display panel of claim 4, wherein the encapsulation layer comprises:

a first inorganic encapsulation layer on the side of the light-emitting function layer away from the substrate;

an organic encapsulation layer on a side of the first inorganic encapsulation layer away from the substrate; and a second inorganic encapsulation layer on a side of the organic encapsulation layer away from the substrate, wherein the internal stress of the second inorganic layer in the second area is greater than an internal stress of the second inorganic encapsulation layer.

7. The display panel of claim 2, wherein a third area where the first orthographic projection overlaps an orthographic projection, on the substrate, of a top surface of the organic protection layer away from the substrate has a width greater than or equal to 10 microns in a direction from the display region to the non-display region.

8. The display panel of claim 2, wherein a distance between an edge of the second inorganic layer away from the display region and an end of the groove close to the display region in a direction from the display region to the non-display region is greater than or equal to 5 microns.

9. The display panel of claim 1, wherein the plurality of openings are arranged in rows and in columns.

10. The display panel of claim 1, wherein the plurality of the openings are arranged in multiple rows, and in a direction from A to A', any one of the openings in a $m^{th}$ row at least partially overlaps a region between two adjacent openings of the openings in a $(m+1)^{th}$ row, wherein m is a positive integer greater than or equal to 1.

11. The display panel of claim 1, wherein each of the openings has a shape of any one of a circle, a triangle, a rectangle and a diamond in a plane perpendicular to a light exit direction of the display panel.

12. The display panel of claim 1, wherein in a direction from the display region to the non-display region, each of the openings has a width greater than or equal to 3 microns, and a spacing between respective centers of every two adjacent ones of the openings is greater than or equal to 5 microns.

13. The display panel of claim 1, further comprising a touch electrode layer sandwiched between the encapsulation layer and the second inorganic layer.

14. The display panel of claim 1, further comprising a touch electrode layer disposed on a side of the second inorganic layer away from the encapsulation layer.

15. A display terminal comprising a terminal body and a display panel integrated with the terminal body, wherein the display panel has a display region and a non-display region on at least one side of the display region, the non-display region comprising a second bendable region close to the display region, and the display panel comprises:

a substrate;

a first inorganic layer disposed on a side of the substrate, and provided with a groove in the second bendable region;

an organic protection layer being disposed on a side of the first inorganic layer away from the substrate, and covering the groove;

a light-emitting function layer being disposed on the side of the first inorganic layer away from the substrate, and comprising a light-emitting pixel disposed in the display region;

an encapsulation layer disposed on a side of the light-emitting function layer away from the substrate, the encapsulation layer extending from the display region to the non-display region, wherein in a cross-section view of the display panel, a first spacing is formed between an edge of the encapsulation layer away from the display region and the groove; and a second inorganic layer disposed on a side of the encapsulation layer away from the substrate, the second inorganic layer extending from the display region to the non-display region and beyond the edge of the encapsulation layer, wherein a plurality of openings are provided in an edge part of the second inorganic layer away from the display region, and an orthographic projection of the plurality of openings on the substrate at least partially overlaps an orthographic projection, on the substrate, of a side slope of the organic protection layer close to the display region.

16. The display terminal of claim 15, wherein a first orthographic projection of the second inorganic layer on the substrate partially overlaps a second orthographic projection of the organic protection layer on the substrate.

17. The display terminal of claim 16, wherein the display region comprises a first bendable region close to the non-display region; and an internal stress of the second inorganic layer in a first area where the first orthographic projection overlaps the second orthographic projection is less than that in a second area where the first orthographic projection does not overlap the second orthographic projection.

18. The display terminal of claim 17, wherein the encapsulation layer comprises:

a first inorganic encapsulation layer on the side of the light-emitting function layer away from the substrate;

an organic encapsulation layer on a side of the first inorganic encapsulation layer away from the substrate; and a second inorganic encapsulation layer on a side of the organic encapsulation layer away from the substrate;

wherein the internal stress of the second inorganic layer in the second area is greater than an internal stress of the second inorganic encapsulation layer.

19. The display terminal of claim 17, wherein the internal stress of the second inorganic layer in the second area is greater than an internal stress of the first inorganic layer.

* * * * *